United States Patent [19]

Scherber

[11] 3,777,363

[45] Dec. 11, 1973

[54] METHOD OF MANUFACTURING A FIELD EFFECT TRANSISTOR

[76] Inventor: Werner Scherber, Holderlinstrasse 8, Nordheim, Germany

[22] Filed: Nov. 30, 1971

[21] Appl. No.: 203,388

[30] Foreign Application Priority Data

Dec. 1, 1970 Germany .................. P 20 58 930.4

[52] U.S. Cl. .................................... 29/571, 29/578

[51] Int. Cl. ............................................ B01j 17/00

[58] Field of Search .................... 117/212, 217, 227; 317/235 R; 29/571, 578

[56] References Cited

UNITED STATES PATENTS

| | | | |
|---|---|---|---|
| 3,474,310 | 10/1969 | Ono et al. | 317/235 R |
| 3,455,020 | 7/1969 | Dawson et al. | 29/571 |
| 3,447,238 | 6/1969 | Heynes et al. | 29/590 |

OTHER PUBLICATIONS

Baker et al., "Field Effect Transistor," IBM Tech. Disclosure Bull., Vol. 11, No. 7, 12–68 p. 849

*Primary Examiner*—Charles W. Lanham
*Assistant Examiner*—W. Tupman
*Attorney*—George H. Spencer et al.

[57] ABSTRACT

A method of manufacturing a field effect transistor includes the steps of: completely removing the masking oxide layer used during the diffusion of two spaced semiconductor regions at one surface of a semiconductor body of opposite conductivity type, applying a thin oxide layer to the surface between the two-spaced regions, applying a thin nitride layer to the thin oxide layer and the remaining exposed parts of the same surface, applying a relatively thick oxide layer to the nitride layer, making first windows through the thick oxide and nitride layers over the two spaced regions and a second window through the thick oxide layer between the two regions and forming metal contacts in the first windows and a metal gate electrode in the second window.

7 Claims, 8 Drawing Figures

METHOD OF MANUFACTURING A FIELD EFFECT TRANSISTOR

BACKGROUND OF THE INVENTION

The invention relates to a method of manufacturing a field effect transistor from a semiconductor body with one type of conductivity, into which are formed, in one face, two spaced apart regions of a second type of conductivity by the use of a masked diffusion process, and wherein the gate electrode is arranged between the two regions on a nitride layer which covers an oxide layer.

With finished MOS field effect transistors the channel regions between the two regions with the second conductivity type is usually covered with a thin layer of oxide. It is known that this thin layer of oxide may be covered preferably with a layer of nitride with a thickness of about 300 to 500 A, preferably with a silicon nitride layer. This silicon nitride layer, which is covered by the gate electrode, causes a reduction of the threshold voltage and a better protection of the channel zone against impurities. By means of a suitable potential at the gate electrode, an inversion layer is produced in the channel region, so that a current flows through the channel between the two regions of the second type of conductivity, if a voltage is applied between the two main electrodes, forming the electric contacts on the regions with the second type of conductivity. This current may be varied by the potential on the gate electrode.

In hitherto known field effect transistors of this type, the silicon nitride layer was applied to the semiconductor arrangement before the manufacture of the metal contacts. This method has certain disadvantages which lead to considerable failure rates, particularly in large circuits with integrated field effect transistors. In order better to explain the method according to the invention, the present process of manufacturing field effect transistors of the kind mentioned above will be briefly described.

A comparatively thick layer of silicon dioxide is applied to one surface of a silicon semiconductor body of n-type conductivity. The thickness must be such that the conductor paths to be produced later, lying on the oxide layers, and leading to the main electrodes, cannot produce inversion layers in the semiconductor. Such inversion layers are very undesirable particularly in integrated circuits, because they can give rise to short circuits between adjacent field effect transistors. This first oxide layer may have a thickness of, e.g., 2 μm. Since thick oxide layers are difficult to etch with sharp contours and exact dimensions, the two regions with the second type of conductivity, usually called source and drain electrodes, are diffused after some preliminary steps.

To this end, a first large opening is made in the first thick oxide layer using the known masking and etching method. Then this opening is again closed with a thinner, more easily etchable oxide layer. From this process, there results a first step between the oxide layers with different thicknesses. Two spaced apart openings are then produced within the said second thinner oxide layer, again using masking and etching methods, through these openings the regions with the second type of conductivity are diffused into the semiconductor body.

Then, the diffusion windows are closed again by a third oxide layer. This third oxide layer is thinner than the other layers, thereby producing a second step in the oxide layer coating. By means of a further masking and etching step, contact windows are made in the oxide above the two regions of the second type of conductivity. Simultaneously, the oxide is removed in the zone between the two regions down to the semiconductor surface. This is followed by a further oxidizing step, producing the extremely thin oxide layer above the controlled channel region. This oxide layer must again be removed in the contact windows. A thin silicon nitride layer is applied to this arrangement and removed again in the contact windows. Finally, metal is evaporated on to the semiconductor surface and the separate contacts for the gate electrode, the source and the drain electrodes are produced by masking and etching the metal layer.

This manufacturing method has a number of serious defects. The layer of photo resist necessary for masking should be distributed uniformly over the wafer by centrifuging the semiconductor wafer. However, agglomerations of the photo resist form on the edges of the steps in the oxide, so that the photo masking at these points becomes inaccurate or ineffective. Furthermore, the edges of the steps make the manufacture of the metal conductor paths more difficult because the paths become very thin in the region of steep edges. Many circuits fail due to fractures of conductor paths in the region of oxide steps.

When the nitride layer is made in the known arrangement, the oxide layers have already been exposed to a number of process steps. It is extremely difficult to keep all steps so clean that the oxide in the region above the channel is stable, and more particularly free from sodium ions. The oxide above the channel region is affected mainly by contaminated oxide layers of adjacent regions.

SUMMARY OF THE INVENTION

It is an object of the invention to reduce or obviate some or all of the disadvantages above discussed.

According to the invention, there is provided a method of manufacturing a field effect transistor comprising the steps of forming at one surface of a semiconductor body of a first type of conductivity, two spaced regions of a second type of conductivity by means of a oxide masked diffusion process, completely removing the masking oxide layer from this surface of the semiconductor body, covering the surface of the semiconductor body between the two spaced regions with a thin oxide layer, applying a thin nitride layer to the thin oxide layer and to the remaining exposed parts of the surface of the semiconductor body, applying to the thin nitride layer an oxide layer which is thick in comparison with the thin oxide layer and the thin nitride layer, forming contact windows above the two spaced regions through the thick oxide layer and the thin nitride layer, forming a contact window for the gate electrode in the thick oxide layer between the two spaced regions and forming metal contacts in the contact windows and a metal electrode in the contact window for the gate electrode.

BRIEF DESCRIPTION OF THE DRAWINGS

The invention will now be described in greater detail, by way of example, with reference to the accompanying drawings, in which.

DESCRIPTION OF THE PREFERRED EMBODIMENT

Figure 1:
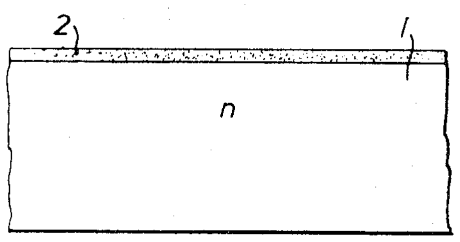
FIG. 1 is a sectional view of a semiconductor body showing a first stage of the method of the invention.

The invention proposes that a field effect transistor having two spaced apart regions of a second type of conductivity formed in one face of a semiconductor body of a first type of conductivity by means of a masked diffusion and a gate electrode arranged between the two regions on a nitride layer covering an oxide layer be manufactured as by the process described below.

After the formation of both second type conductivity regions, the masking layer covering the semiconductor surface is removed in its entirety, the semiconductor surface between both regions is covered with a thin oxide layer, a thin nitride layer is applied to this oxide layer, and to the remaining exposed parts of the semiconductor surface, followed by a relatively thick oxide layer applied to the nitride layer, providing two contact windows for the two regions of the second type of conductivity in the thick oxide layer and in the nitride layer thereunder, an opening is formed in the oxide layer above the zone between the two regions down to the nitride layer, and finally metal contacts are provided in these openings.

The method according to the invention is particularly suitable for semiconductor arrangements for integrated semiconductor circuits which are arranged in a silicon semiconductor body. In this case, the oxide layers consist preferably of a silicon oxide, and particularly of silicon dioxide, while the nitride layer consists of silicon nitride.

The comparatively thick silicon oxide layer and the silicon nitride layer are preferably made by pyrolytic deposition. The thin oxide under the gate electrode is preferably made by thermal oxidation of the silicon.

The method according to the invention is particularly suitable for the manufacture of integrated circuits consisting entirely or partially of a plurality of field effect transistors with insulated gate electrodes.

The method according to the invention has a number of advantages. All insulated layers used are comparatively thin. This means that no undesirable steps or shoulders can affect the photo resist and evaporation processes. Even the step in the topmost pyrolytic oxide layer is comparatively small and is usually of the order of about 0.5 μm. In view of the comparatively thin insulating layers, even very small structures may be manufactured accurately. The new method offers better protection against impurities. Only the manufacture of the oxide above the gate zone and the manufacture of the nitride layer must take place under very clean conditions. The oxide above the gate zone is hermetically sealed by the nitride layer arranged above it. It is, therefore, impossible for impurities in the adjacent oxide layers to penetrate into the oxide layer above the channel zone. This results in a particularly good long period stability, even in packages which are not completely tightly closed. The method according to the invention saves several process steps.

Referring now to the drawings, the semiconductor arrangement shown relates to an integrated circuit with a plurality of field effect transistors. For the sake of simplicity, the drawings show only a section of the arrangement with one transistor.

Figure 2:
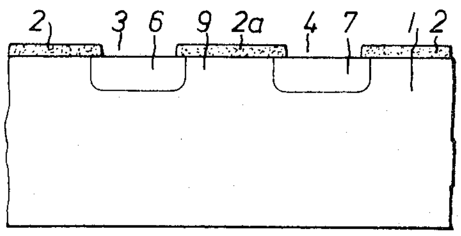
FIG. 2 is a sectional view similar to FIG. 1, but showing a second stage of the method.

According to FIG. 1, a silicon semiconductor body with n-type conductivity, has on one surface a coating of silicon dioxide 2. This layer 2 is preferably formed by thermal oxidation and has a thickness of about 0. 5 μm. Two spaced openings 3 and 4 are made in the oxide layer 2, as shown in FIG. 2, by means of the known photo resist masking and etching methods. Between the two openings, a zone remains which is covered with a part of the oxide layer 2*a*. This oxide layer covers the controllable semiconductor channel region. Through the two openings 3 and 4, e.g. boron, is diffused into the semiconductor body, so that the semiconductor body acquires p-type conducitivity in the region of the two surface regions 6 and 7. The channel 9 comprises the part between these two regions of p-type conductivity.

After the manufacture of the two regions 6 and 7, the oxide layer 2 is completely removed from the semiconductor surface, then, the semiconductor surface may be cleaned very efficiently, using methods or reagents which attack an oxide (e.g. hydrofluoric acid).

Figure 3:
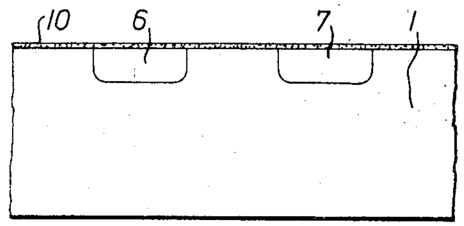
FIG. 3 is a sectional view similar to FIG. 1, but showing a third stage of the method.

According to FIG. 3, the semiconductor surface is then again covered with a thin oxide layer, and more particularly with a layer of silicon dioxide, 10. The thickness of this oxide layer 10 corresponds to the thickness necessary for the oxide layer under the gate electrode. It may amount, for example, to 1,000 A. Also this oxide layer is made preferably by thermal oxidation.

Figure 4:
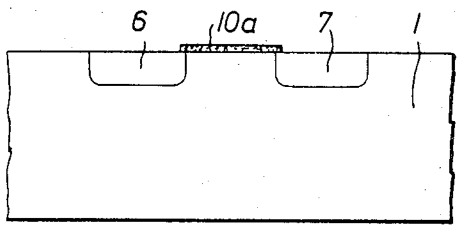
FIG. 4 is a sectional view similar to FIG. 1, but showing a fourth stage of the method.
Figure 8:
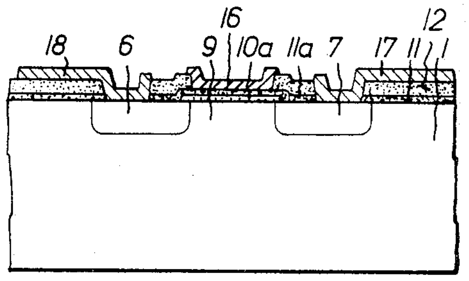
FIG. 8 is a sectional view similar to FIG. 1, but showing a final stage of the method of the invention.

By a further masking and etching step, the oxide layer 10 is again removed everywhere with the exception of the part covering the channel 9. The remaining portion of this oxide layer covering the channel region is shown in FIG. 4 at 10*a*.

Figure 5:
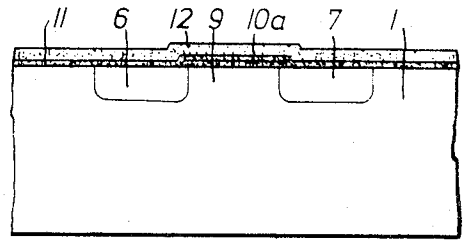
FIG. 5 is a sectional view similar to FIG. 1, but showing a fifth stage of the method.

Next, as shown in FIG. 5, a thin nitride layer, and more particularly a layer 11 of silicon nitride is applied to the whole surface of the semiconductor body, i.e. both to the oxide layer 10*a* and to the other exposed parts of the semiconductor surface. This may be achieved, for example, by pyrolytic decomposition of monosilane and $NH_3$. The silicon nitride layer may have a thickness of, e.g., 300 A. Next, the nitride layer 11 is covered with an oxide layer, and preferably a layer 12 of silicon oxide. This layer also may be produced, for example, by the pyrolytic decomposition of monosilane and oxygen. The thickness of the oxide layer 12 is about 0.5 μm. For making the nitride layer 11 and the oxide layer 12, also other deposition methods may be used.

Figure 6:
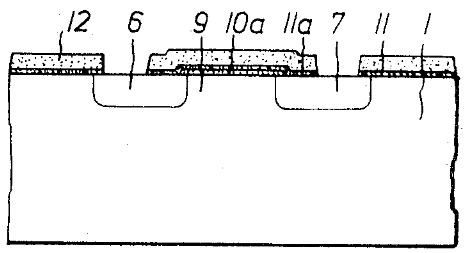
FIG. 6 is a sectional view similar to FIG. 1, but showing a sixth stage of the method.

As shown in FIG. 6, contact making windows 13 and 14 are then produced within the two layers 11 and 12 above the regions 6 and 7. To this end, the oxide layer is masked with a layer of photo resist. For etching the nitride layer under the oxide layer, the oxide layer is preferably used as the mask. The nitride layer may be etched through, for example, with boiling phosphoric acid.

Figure 7:
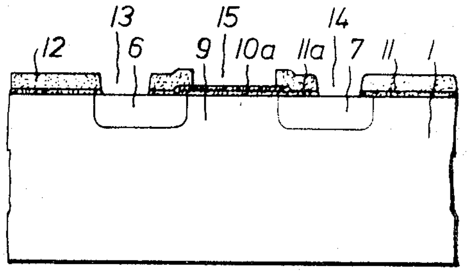
FIG. 7 is a sectional view similar to FIG. 1, but showing a seventh stage of the method.

The oxide layer above the channel is then removed in a separate step, using masking and etching techniques. In this manner, a recess 15 in the oxide layer 12 is produced reaching to the nitride layer 11*a*, as shown in FIG. 7. Precision etching is possible, for example, with buffered hydrofluoric acid because buffered hydrofluoric acid attacks silicon nitride much more slowly than silicon dioxide.

Finally, a metal layer, for example of aluminium, is applied by evaporation on the semiconductor arrangement shown in FIG. 7. By masking and etching, this metal layer is divided into the gate electrode and the source and drain electrodes 18 and 17.

Preferably, all electrodes extend on the oxide layer 12; care must be taken, however, with the gate electrode to ensure that it overlaps the p-n junctions surrounding the two regions 6 and 7 as little as possible in order to keep the unit capacitance low.

The electrodes 18 and 17 extend in the direction remote from the gate electrode over the oxide layer 12 and terminate in conductor paths which either lead to adjacent elements or terminate in large area connecting terminals. Although the oxide layer under these conductor paths is comparatively thin, there is no risk of causing inversion layers on the semiconductor surface in undesirable positions. This is due, on the one hand, to the fact that the layers covering the semiconductor surface have a high degree of purity, and on the other hand, the nitride layer provided on the surface of the semiconductor counteracts the formation of an inversion layer, due to the material properties of the nitride layer.

It should be pointed out that the above described method according to the present invention also may be advantageously utilized for manufacturing memory devices on the base of MNOS field effect transistors. It will be understood that the above description of the present invention is susceptible to various modifications, changes and adaptations.

What is claimed is:

1. A method of manufacturing a field effect transistor comprising the steps of forming at one surface of a semiconductor body of a first type of conductivity, two spaced regions of a second type of conductivity by means of a oxide masked diffusion, completely removing said masking oxide layer from said one surface of said semiconductor body, covering the portion of said one surface of said semiconductor body between said two spaced regions with a thin oxide layer, applying a thin nitride layer both to said thin oxide layer and to the remaining exposed parts of said one surface of said semiconductor body, applying to said thin nitride layer an oxide layer which is thick in comparison with said thin oxide layer and said thin nitride layer, forming contact windows above said two spaced regions through said thick oxide layer and said thin nitride layer, forming a gate electrode window in said thick oxide layer between said two spaced regions and forming metal contacts in said contact windows and a metal electrode in said gate electrode window.

2. A method as defined in claim 1, wherein silicon dioxide is used for said thin oxide layer and said thick oxide layer and silicon nitride is used for said nitride layer.

3. A method as defined in claim 2, and comprising producing said silicon nitride layer and said thick silicon oxide layer by pyrolytic methods.

4. A method as defined in claim 2, wherein a semiconductor body of silicon of n-type conductivity is used as said semiconductor body.

5. A method as defined in claim 2, and comprising forming said metal contacts and said gate electrode to extend over said thick oxide layer.

6. A method as defined in claim 5, and comprising forming said metal contacts for said two spaced regions to extend as conductor paths over said thick oxide layer and connecting said conductor paths to contacts of other elements arranged in said semiconductor body.

7. A method as defined in claim 5, and comprising forming said metal contacts for said two spaced regions to extend as conductor paths over said thick oxide layer and terminating them in large area connecting terminals.

* * * * *

UNITED STATES PATENT OFFICE

CERTIFICATE OF CORRECTION

Patent No. 3,777,363 Dated December 11, 1973

Inventor(s) Werner Scherber

It is certified that error appears in the above-identified patent and that said Letters Patent are hereby corrected as shown below:

In the heading of the patent, after line 4, insert the following:

-- [73] Assignee: Licentia Patent-Verwaltungs-G.m.b.H.
Frankfurt am Main, Germany --.

Column 3, line 26, cancel "as".

Signed and sealed this 10th day of September 1974.

(SEAL)
Attest:

McCOY M. GIBSON, JR.
Attesting Officer

C. MARSHALL DANN
Commissioner of Patents